United States Patent
Nakajima

(10) Patent No.: US 7,054,953 B1
(45) Date of Patent: May 30, 2006

(54) METHOD AND APPARATUS FOR SENDING AND RECEIVING A DATA STRUCTURE IN A CONSTITUTING ELEMENT OCCURRENCE FREQUENCY BASED COMPRESSED FORM

(75) Inventor: Satoshi Nakajima, Redmond, WA (US)

(73) Assignee: UI Evolution, Inc., Bellevue, WA (US)

( * ) Notice: Subject to any disclaimer, the term of this patent is extended or adjusted under 35 U.S.C. 154(b) by 998 days.

(21) Appl. No.: 09/708,179

(22) Filed: Nov. 7, 2000

(51) Int. Cl.
G06F 15/16 (2006.01)

(52) U.S. Cl. ............... 709/246; 709/247; 709/238; 707/101

(58) Field of Classification Search ........... 709/246, 709/247, 201, 238; 707/101; 710/68; 341/51
See application file for complete search history.

(56) References Cited

U.S. PATENT DOCUMENTS

| | | | |
|---|---|---|---|
| 4,386,416 A | | 5/1983 | Giltner et al. |
| 5,254,990 A | * | 10/1993 | Yoshida et al. ............... 341/51 |
| 5,463,390 A | * | 10/1995 | Whiting et al. ............... 341/51 |
| 5,530,645 A | | 6/1996 | Chu |
| 5,801,648 A | * | 9/1998 | Satoh et al. .................. 341/50 |
| 5,854,597 A | * | 12/1998 | Murashita et al. ........... 341/51 |
| 5,872,530 A | * | 2/1999 | Domyo et al. .............. 341/106 |
| 5,884,014 A | | 3/1999 | Huttenlocher et al. |
| 5,907,637 A | * | 5/1999 | Murashita et al. .......... 382/239 |
| 5,991,713 A | | 11/1999 | Unger et al. |
| 5,999,949 A | | 12/1999 | Crandall |
| 6,011,905 A | | 1/2000 | Huttenlocher et al. |
| 6,012,063 A | | 1/2000 | Bodnar |
| 6,094,634 A | * | 7/2000 | Yahagi et al. ............... 704/260 |
| 6,163,811 A | | 12/2000 | Porter |
| 6,635,088 B1 | * | 10/2003 | Hind et al. .................. 707/101 |

FOREIGN PATENT DOCUMENTS

EP      0 896 284 A1     2/1999

(Continued)

OTHER PUBLICATIONS

Bell et al., "Modeling for Text Compression", ACM Computing Surveys, vol. 21, No. 4, Dec. 1989 (pp. 1-35).

(Continued)

Primary Examiner—Philip B. Tran
(74) Attorney, Agent, or Firm—Schwabe, Williamson & Wyatt, P.C.

(57) ABSTRACT

In accordance with a first aspect of the present invention, a digital device is provided with a data transmitter designed to receive constituting elements of a data structure, determine occurrence frequency of each unique constituting element in the data structure, assign a cookie representation to each of the unique constituting elements based at least in part on the occurrence frequencies of the unique constituting elements, and transmit the data structure implicitly in a substantively equivalent form that allows a receiver of the data structure in the substantively equivalent form to be able to reconstitute the data structure using the occurrence frequency based cookie representations. In accordance with another aspect of the present invention, a digital device is provided with a data receiver designed to receive unique constituting elements of a data structure transmitted in a pre-determined manner, infer corresponding cookie representations for the received unique constituting elements in accordance with their manner of transmissions under the pre-determined manner of transmission, and receive the constituting elements of the data structure in a representative form. In one embodiment, the data receiver is further designed to reconstitute the constituting elements of the data structure, received in the representative form, based on the inferred cookie representations.

22 Claims, 7 Drawing Sheets

FOREIGN PATENT DOCUMENTS

| | | |
|---|---|---|
| EP | 1 115 207 A1 | 7/2001 |
| GB | 0896284 A1 * | 2/1999 |
| JP | S63-232626 | 9/1988 |
| WO | WO 00 70770 A | 11/2000 |

OTHER PUBLICATIONS

Black et al., "A Compact Representation for File Versions: A Preliminary Report", IEEE, 1989 (pp. 321-330).

WAPWML, WAP-191-WML "Wireless Application Protocol, Wireless Markup Language Specification", Version 1.3, Wireless Application Protocol Forum, Ltd 2000 (41 pages).

International Business Machines Corporation, "Technique to Generate Very Efficient Compression/Decompression Engines for XML Data Streams Based on the stream's DTD", Research Disclosure, Feb. 2000, pp. 399-400, XP000969166, ISSN: 0374-4353, Kenneth Mason Publications, Hampshire, GB, No. 430188.

Liefke, H. & Suciu, D., "XMill: An Efficient Compressor for XML Data", SIGMOD Record, Association for Computing Machinery, New York, U.S., vol. 29, No. 2, Jun. 2000, pp. 153-164, XP001002286.

* cited by examiner

300
| Cookies ~ 302 | Tokens ~ 304 | Occurrence Frequency ~ 306 |
|---|---|---|
|  |  |  |
|  |  |  |
|  |  |  |
|  |  |  |
|  |  |  |
|  |  |  |
|  |  |  |
Figure 3a
310
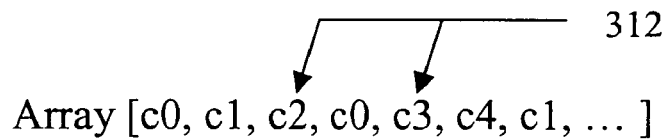
Array [c0, c1, c2, c0, c3, c4, c1, ... ]
Figure 3b
320
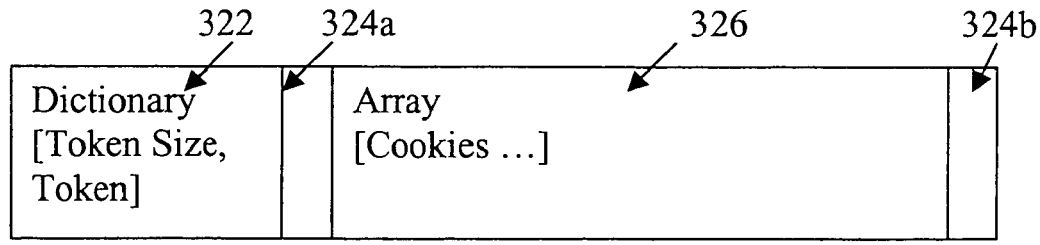
Figure 3c

400

```
<Employees>
  <Employee ID="1" Title="Software Engineer">Alex
      Rodriguez</Employee>
  <Employee ID="2" Title="Software Engineer">Jay
      Buner</Employee>
  <Employee ID="3" Title="Software Engineer">Mike
      Cameron</Employee>
</Employees>
```

"<", "Employees", ">", "<", "Employee" "ID" "="
"1"

| Cookie | Tokens | Frequency |
|---|---|---|
| 0 | "<" | (4) |
| 1 | "Employees" | (1) |
| 2 | ">" | (8) |
| 3 | "Employee" | (3) |
| 4 | "</" | (4) |
| 5 | "ID" | (3) |
| 6 | "=" | (6) |
| 7 | "1" | (1) |
| 8 | "Title" | (3) |
| 9 | "Software Engineer" | (3) |
| ... | | |

Array[] = { 0, 1, 2, 0, 3, 5, 6, ... }

| Cookie | Tokens | Frequency |
|---|---|---|
| 1 | ">" | (8) |
| 2 | "=" | (6) |
| 3 | "Employee" | (6) |
| 4 | "<" | (4) |
| 5 | "</" | (4) |
| 6 | "ID" | (3) |
| 7 | "Software Engineer" | (3) |
| 8 | "Title" | (3) |
| 9 | "Employees" | (2) |
| 10 | "1" | (1) |
| ... | | |

Array[] = { 4, 8, 1, 4, 3, 6, 10, 8, 7, ... }

| 442 | 444a | 446 | 444b |

| 0x01, "<", 0x01, ">", 0x02, "</", 0x01, "=", 0x08, "Employee", ... | 0x 00 | 0x04, 0x08, 0x01, 0x04, 0x03, 0x06, 0x0a, 0x08, 0x07, ... | 0x 00 |

Figure 4g

METHOD AND APPARATUS FOR SENDING AND RECEIVING A DATA STRUCTURE IN A CONSTITUTING ELEMENT OCCURRENCE FREQUENCY BASED COMPRESSED FORM

BACKGROUND OF THE INVENTION

1. Field of the Invention

The present invention relates to the fields of data processing. More specifically, the present invention relates to the sending and receiving of data structures in a bandwidth reduction form.

2. Background Information

Recently, with advances in the Internet and web based applications, semi-structured, data structures, such as Extensible Markup Language (XML) data have become an industry standard mechanism to either transfer or store data. Semi-structured data structures are favored over other conventional fixed and/or application specific data structures because of the extensibility, transparency, platform-independency and manageability. These data structures allow two pieces of software programs that are independently developed to communicate with each other. However, transmission of these semi-structured data structures has at least two drawbacks, a) the size of the data structure having to be transferred and (b) the associated processing cost (especially on the receiver side).

Size: Semi-structured data structures, such as XML data structures, are typically very redundant when compared to other conventional fixed, application specific data structures. Many tag names and attribute names must be repeated over and over again. For example, it usually takes 100–300% more bytes to represent the same data in XML. In addition, it is very common that there are many duplicate attribute values. Consider the example "Employees" XML data structure illustrated in FIG. 4a, the tag name "Employee" and attribute names "Employee ID" and "Title" are repeated over and over again.

Processing Cost: Semi-structured data structures, such as XML, are also very expensive to parse. Typically, the data sender either builds the data structure directly concatenating a number of strings or feeding them into a stream, or builds an object hierarchy and then serializes it into a string or stream. On the receiver side, the receiver code must then scan the data string/stream to sequentially look for space characters to tokenize, and compare each tag names and attributes with known keywords. Further, such parsing requires a lot of memory, especially if each token is stored as a separate string object.

These drawbacks are especially problematic for smaller devices with limited CPU-power and small amount of memory (such as wireless mobile phones and palm sized personal digital assistants) with lower data transmission speed. In certain applications, such as Nippon Telephone Telegraph—DoCoMo's iMode, the operation cost can be significantly higher, as the application operator charges for the service on a per-packet basis.

Thus, a more efficient approach to transmitting such data structures is desired.

SUMMARY OF THE INVENTION

In accordance with a first aspect of the present invention, a data transmitter is designed to receive constituting elements of a data structure, determine occurrence frequency of each unique constituting element in the data structure, assign a cookie representation to each of the unique constituting elements based at least in part on the occurrence frequencies of the unique constituting elements, and transmit the data structure implicitly in a substantively equivalent form that allows a receiver of the data structure in the substantively equivalent form to be able to reconstitute the data structure using the occurrence frequency based cookie representations.

In accordance with another aspect of the present invention, a data receiver is designed to receive unique constituting elements of a data structure transmitted in a pre-determined manner, infer corresponding cookie representations for the received unique constituting elements in accordance with their manner of transmissions under the pre-determined manner of transmission, and receive the constituting elements of the data structure in a representative form. In one embodiment, the data reeiver is further designed to reconstitute the constituting elements of the data structure, received in the representative form, based on the inferred cookie representations.

In one embodiment, the data structure is a XML data structure. The constituting elements include tag names, attribute names, and attritbute values.

In one embodiment, a digital device is provided with the data transmitter. In another embodiment, a digital device is provided with the data receiver. In yet another embodiment, a digital device is provided with both.

In one embodiment, the digital device is a wireless mobile phone. In another, the digital device is a palm sized personal digital assistant, a notebook sized computer, a desktop computer, a set top box, or a server.

BRIEF DESCRIPTION OF DRAWINGS

The present invention will be described by way of exemplary embodiments, but not limitations, illustrated in the accompanying drawings in which like references denote similar elements, and in which:

FIGS. 3a–3c illustrate example data structures suitable for use to practice the present invention, in accordance with one embodiment;

FIGS. 4a–4g illustrate an example application of the present invention to the transmission of an example XML data structure.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented using terms such as data structures, tag names, attribute names, and so forth, commonly employed by those skilled in the art to convey the substance of their work to others skilled in the art. Parts of the description will be presented in terms of operations performed by a computing device, using terms such as receiving, determining, transmitting, and so forth. As well understood by those skilled in the art, these quantities and operations take the form of electrical, magnetic, or optical signals capable of being stored, transferred, combined, and otherwise manipulated through mechanical and electrical components of a digital system. The term digital system includes general purpose as well as special purpose computing machines, systems, and the like, that are standalone, adjunct or embedded.

Various operations will be described in turn in a manner that is most helpful in understanding the present invention, however, the order of description should not be construed as to imply that these operations are necessarily order dependent. Furthermore, the phrase "in one embodiment" will be used repeatedly, however the phrase does not necessarily refer to the same embodiment, although it may.

Overview

Figure 1:
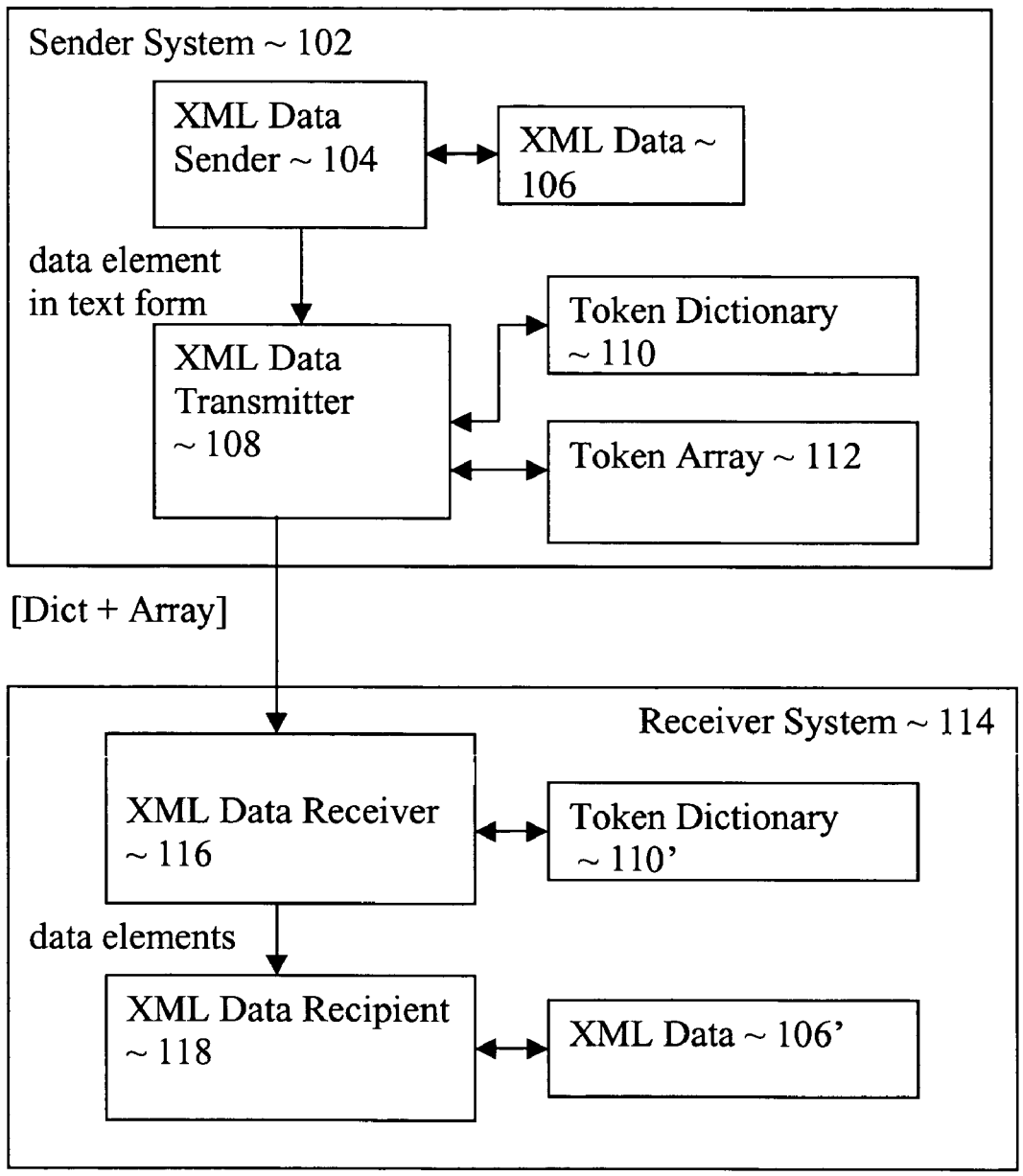
FIG. 1 illustrates an overview of the present invention, in accordance with one embodiment.

Referring now to FIG. 1, wherein a block diagram illustrating an overview of the present invention, in accordance with one embodiment is shown. As illustrated, in accordance with one aspect of the present invention, data sender system 102 is advantageously provided with data transmitter 108 of the present invention, to assist a data sending application, such as data sender 104, to transmit semi-structured data structures, such as XML data structures, as represented by data structures 106, in a more efficient, compact, and bandwidth reduced manner. As will be described in more detail below, data transmitter 108 effectuates transmission of data structures 106 in the desired manner, by transmitting occurrence frequency based cookie representations of the "tokens", i.e. data elements, of data structures 106 instead. For the illustrated embodiment, the novel transmission of the occurrence frequency based cookie representations are performed, employing dictionary 110 and array 112. As will be described in more detail below, dictionary 110 is employed to store the occurrence frequency based cookie representations for encoding the "tokens", whereas array 112 is used to store the encoded "tokens", i.e. their cookie representations.

In accordance with another aspect of the present invention, data receiver system 114 is advantageously provided with complementarily equipped data receiver 116 to assist the ultimate data recipient 118 in receiving data structure 106 transmitted in the above described efficient manner. For the illustrated embodiment, data receiver 116 effectuates the assistance employing dictionary 110', which as will be described in more detail below, is provided by data transmitter 108.

Except for the respective provisions of data transmitter 108 and data receiver 116 to sender system 102 and receiver system 114, sender system 102 and receiver system 114 are otherwise intended to represent a broad range of digital devices known in the art, including but are not limited to, wireless mobile phones, palm sized personal digital assistants, notebook sized computers, desktop computers, set-top boxes, servers, and the like. Of course, sender system 102 and receiver system 114 may also be further provided with data receiver 116 and data transmitter 108 respectively, allowing these systems to function in the role of a data sender at one point in time, and in the role of a data receiver at another point in time. For these embodiments, of course data transmitter 108 and data receiver 116 may be provided as a combined unit or component, i.e. a data tranceiver, having both the transmission as well as the reception capabilities of the present invention. On the other hand, in alternate embodiments, data sender 104 and data transmitter 108 may be disposed in different systems. Similarly, data receiver 116 and ultimate data recipient 118 may also be disposed in different systems.

Further, sender system 102 and receiver system 114 may be coupled to each other via any one of a number of wireless or wireline based communication interfaces, using any one of a number of communication protocols. For example, the communication interface may be a wireless medium, using the TCP/IP communication protocol, signaled in accordance with the GSM, CDPD, CDMA or WCDMA signalling protocol. Alternatively, the communication may be a wireline based medium, again using the TCP/IP communication protocol, signaled in accordance with the Ethernet signalling protocol. In general, as those skilled in the art will appreciate, the present invention may be practiced in any communication/signal protocols on any communication medium.

Similarly, while for ease of understanding, the present invention will be described referencing XML data structures and examples expressed in XML, those skilled in the art would appreciate that the present invention may also be practiced on other data structures, including but are not limited to HTML or WML encoded contents.

Method

Figure 2A:
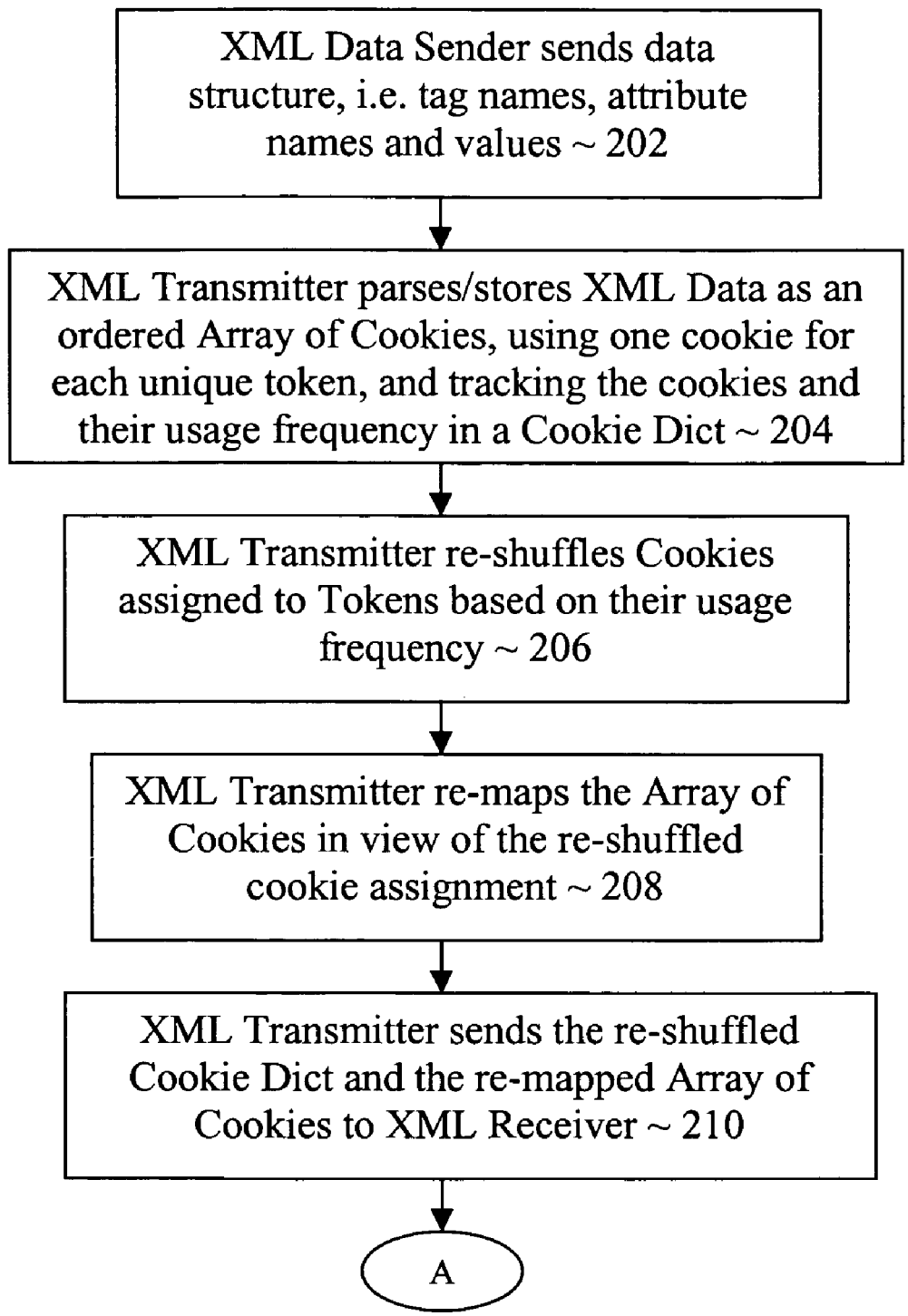
FIGS. 2a–2b illustrate a method view of the present invention, in accordance with one embodiment.
Figure 2B:
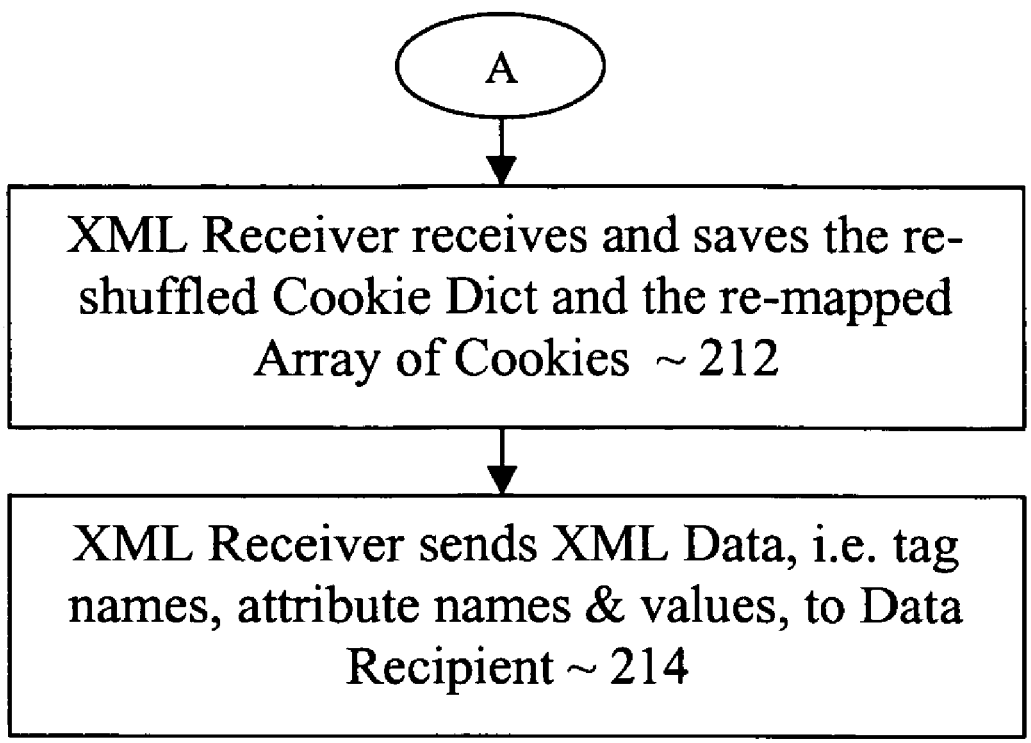

Referring now to FIGS. 2a–2b, wherein two block diagrams illustrating the novel data sending and receiving method of the present invention in further detail, in accordance with one embodiment, are shown. As illustrated in FIG. 2a, at block 202, data sender 104 "transparently" sends constituting elements of data structure 106 (such as tag names, attribute names, and attribute values, in the case of an XML structure) in plain text, as in the prior art. That is, legacy data sender 104 may continue to send data as in the prior art without having to make any adjustments to its operation, nor having to be cognizant of the practice of the present invention. However, in alternate embodiments, data sender 104 who is cognizant of the present invention, may further take advantage by sending the data elements of data structure 106 in token form. In accordance with the present invention, the data elements are received by data transmitter 108 and turn into token form if received in the plain text form. Data transmitter 108 would parse the received data structure 106 to "tokenize" its data elements, using any one of a number of parsing techniques known in the art. Using example "Employees" XML data structure 400 illustrated in FIG. 4a as an example, as the constituting elements of example structure 400, i.e. "<", "Employees", ">", and so forth, are sent "transparently" by data sender 104, data transmitter 108 receives the constituting elements as "tokens", as illustrated in FIG. 4b.

Referring back to FIGS. 2a–2b, at block 204, data transmitter 108 encodes the "tokens" with cookie representations. More importantly, the cookie representations are functionally dependent on the occurrence frequencies of the unique "tokens" in data structure 106. Using the example "Employees" XML data structure 400 illustrated in FIG. 4a as an example again, the constituting elements are encoded as illustrated in FIG. 4f, using the occurrence frequency based cookie representations of FIG. 4e. For example, the token ">" is encoded with the numeric cookie representation of "1", as the token ">" is the most frequently occurred token, among the tokens of example data structure 400 (8 times), the token "=" is encoded with the numeric cookie representation of "2", as the token "=" is the next most frequently occurred token, among the tokens of example data structure 400 (6 times), and so forth. [Ties are broken arbitrarily.] In one embodiment, the encoding is a multi-step process, to be described in more detail below.

Thus, under this embodiment of the novel occurrence frequency based encoding scheme of the present invention, the most frequently occurred token is encoded with a numeric cookie representation having the lowest numeric value (relative to other numeric cookie representations employed for the data structure being transmitted), the next most frequently occurred token is encoded with a numeric cookie representation having the next lowest numeric value, and so forth.

As those skilled in the art would appreciate, under this scheme, the first 127 most frequently occurred unique tokens may be transmitted employing one byte of bandwidth for each token, that is with each token as a datum with a size of one byte, whereas the next 32,640 most frequently occurred unique tokens may be transmitted employing two bytes of bandwidth for each token, that is with each token as a datum with a size of two bytes. The two formats may be differentiated e.g. using the most significant bit. As a result, a data structure may be advantageously transmitted with further reduction in bandwidth required, as the more frequently occurred tokens are transmitted with one byte encodings, while only the less frequently occurred tokens are transmitted with two byte encodings.

Referring back again to FIGS. 2a–2b, at block 206, data transmitter 108 transmits the unique "tokens" and "conveys" their cookie representations to data receiver 116. In one embodiment, the cookie representations of the "tokens" are implicitly conveyed. That is, the cookie representation are not explicitly transmitted. Instead, the unique "tokens" are transmitted in a pre-determined manner, and data receiver 116 infers the cookie representations from the manner the unique "tokens" are transmitted under the predetermined manner. Again referring to the example encoding illustrated in FIG. 4e, the tokens ">", "Employees", and so forth, are transmitted in order of their occurrence frequencies, accordingly their cookie representations, i.e. "1", "2", and so forth, may be inferred from the transmission positions of the tokens.

Thereafter, at block 208, data transmitter 108 transmits the "tokens" in their encoded representative form. In one embodiment, data transmitter 108 transmits the tokens (implicitly conveying their encodings), and the encoded representations as one contiguous string or stream (to be described more fully below). At block 210, upon receipt of the list of unique tokens (and their encodings), and the encoded representations, data receiver 116 reconstitutes the original data structure, i.e. regenerating the original data elements based on the received encoding representations and the unique tokens (and their corresponding encoding representations), for ultimate data recipient 118. As a result, the amount of processing required on the receiver side to accept the transmitted data structure is also significantly reduced. Further, by remapping the tokens back to the original data elements, the method may be made transparent to legacy data receivers. However, in alternate embodiments, data recipients 118 cognizant of data receivers 116 may further take advantage of the present invention, and reduces its storage employed to store received data structures by having data receiver 116 provides the received data structure in the token form, without reconstituting the original data elements.

FIG. 2b illustrates the encoding operation of block 204 in further details, in accordance with one embodiment. As illustrated, at blocks 222 and 224, data transmitter 108 first encodes the tokens with an initial encoding as the tokens are received/identified, and stores the received/identified tokens in their representative form. Additionally, data transmitter 108 tracks each of the unique tokens encountered, its initial encoding, and more importantly, the occurrence frequency of each of the unique tokens. For the illustrated embodiment, the initial encoding is simply the order the unique tokens are encountered. For example, for the example "Employee" XML data structure 400 of FIG. 4a, the initial encoding employed is as illustrated in FIG. 4c. That is, token "<" is encoded with the numeric cookie representation of "0", as it is encountered first, token "Employees" is encoded with the numeric cookie representation of "1", as it is encountered next, and so forth. Thus, example "Employee" XML data structure 400 may be stored in a representative form in array 430a (corresponding to array 112 of FIG. 1) as illustrated in FIG. 4d.

Thus, upon receipt of all tokens, i.e. data elements of the data structure being transmitted, the occurrence frequencies of the unique tokens of the data structure would be established. For the example XML data structure 400, it would have established that token "<" occurs 4 times, token "Employees" occurs once, token ">" occurs 8 times (the most frequent), and so forth, as illustrated in FIG. 4c.

Thereafter, at blocks 226 and 228, data transmitter 108 replaces the initial cookie representations with replacement cookie representations that are functionally dependent on the occurrence frequency of the unique tokens, and the stored "tokens" in their representative form are re-mapped to new representations. For example, the replacement cookie representation of "1" is assigned to replace the initial cookie representation of "2" for the most frequently occurred token ">", the replacement cookie representation of "2" is assigned to replace the initial cookie representation of "6" for the second most frequently occurred token "=", and so forth. Correspondingly, the stored tokens in their initial representations (FIG. 4d) are remapped to the replacement representations (FIG. 4f). The remapping e.g. may be performed with the assistance of a remapping vector (not shown), which is known in the art.

Thus, it can be seen that the encoding or compression operations of the present invention may be performed in a relatively straight forward manner, with relative low memory and processing requirements. As a result, the amount of memory and processing required on the sender side to "compress" the data elements for transmission (to achieve the desired bandwidth consumption reduction), under the present invention, is also advantageously smaller than other compression techniques known in the art, such as "Zip".

Data Structures

FIGS. 3a–3c illustrate a number of example data structures suitable for use to practice the present invention, in accordance with one embodiment. Shown in FIG. 3a is example table 300 having at least three columns 302–306, suitable for use by data transmitter 108 to store the cookie representations (initial as well as final for the earlier described two steps embodiment), the represented tokens, and their occurrence frequencies. An abridged version of example table 300, without column 306 may be used by data receiver 116 to store the cookie representations, and the represented unique tokens. Shown in FIG. 3b is example array 310 having a number storage slots suitable for use by data transmitter 108 to stored the encoded representations (c0, c1, c2 etc.) of the tokens of a data structure being transmitted. Shown in FIG. 3c is example string or stream 320 having two sections 322 and 326, separated by delimiters 324a–324b, suitable for use by data transmitter 108 to transmit the unique tokens (and implicitly convey their encoding representations), and the encoded representations of the tokens of a data structure being transmitted. For the illustrated embodiment, first section 322 is employed to transmit the unique tokens (and implicitly convey their encoding representations). Each unique token is preceded by the token size. For example, the token "<" is preceded by the token size value of "0x01", the token "</" is preceded by the token size "0x02", and so forth (as illustrated in FIG. 4g). The encoding representation for the token "<" is "1", as implied by the fact that the token is transmitted in the first transmission position, the encoding representation for the token "</" is "3", as implied by the fact that the token is transmitted in the third transmission position, and forth. Referring back to FIG. 3c, as illustrated, second section 326 is employed to transmit the encoded representations of the tokens of the data structure being transmitted.

Example Digital Device

Figure 5:
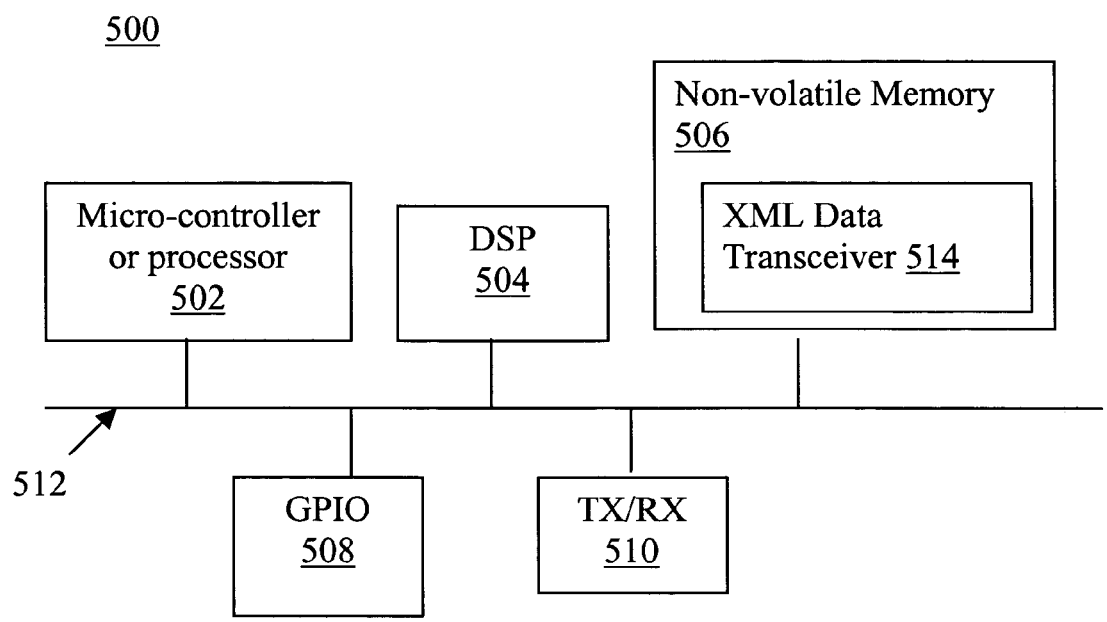
FIG. 5 illustrates an architectural view of an example computing device, suitable for practicing the present invention, in accordance with one embodiment.

FIG. 5 illustrates an example computing device suitable for use to practice the present invention, in accordance with one embodiment. As shown, computing device 500 includes general purpose processor 502, digital signal processor (DSP) 504, and system memory 506. Additionally, device or system 500 includes GPIO 508 (for interfacing with I/O devices such as keyboard, cursor control and so forth) and communication interfaces 510 (such as network interface cards, modems, wireless transceivers and so forth). The elements are coupled to each other via system bus 512, which represents one or more buses. In the case of multiple buses, they are bridged by one or more bus bridges (not shown). More importantly, device or system 500 is provided with data transceiver 514 incorporated with the teachings of the present invention to send and receive data structures in the above described more efficient constituting element occurrence frequency based compression form.

The number and type of processor, the size of memory, as well as the number of other elements employed are typically dependent on the intended usage of example computing device 500. For example, if used as a wireless mobile telephone or a palm sized personal digital assistant, probably a relatively lower performance processor and smaller amount of memory are used. On the other hand, if used as a notebook computer or a set top box, probably a relatively higher performance processor and more amount of memory are used, and may be even with the additional employment of mass storage devices. If used as a desktop computer or a server, probably even multiple high performance processors are employed, but may be without the employment of DSP 504 instead.

Each of these elements performs its conventional functions known in the art. In particular, system memory 504 is employed to store a copy of the programming instructions implementing data transceiver 514. Except for its use to host novel data transceiver 514 incorporated with the transmit and receive teachings of the present invention, the constitution of these elements 502–512 are known, and accordingly will not be further described.

CONCLUSION AND EPILOGUE

Accordingly, a method and apparatus for sending and receiving a data structure in a constituting element occurrence frequency based compressed form has been described. As mentioned earlier, the present invention significantly reduces the number of bytes required to be transmitted, as well as the amount of memory and the amount of processing required on the sender and the receiver systems.

While the present invention has been described in terms of the above illustrated embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. A method comprising:
    receiving a plurality of constituting elements of a data structure;
    determining occurrence frequency of each unique constituting element in said data structure;
    assigning a cookie representation to each of said unique constituting elements based at least in part on the occurrence frequencies of said unique constituting elements;
    transmitting a list of said unique constituting elements in the order of their occurrence frequencies to allow a receiver of said list of said unique constituting elements to infer the corresponding cookie representations of the unique constituting elements; and
    transmitting said data structure in a representative form encoded with said cookie representations.

2. The method of claim 1, wherein said determining and assigning comprises assigning an initial cookie representation to each unique constituting element as the constituting elements are received, and tracking occurrence frequencies of the unique constituting elements, and upon receipt of all constituting elements of the data structure, re-assigning a final cookie representation for each of the unique constituting elements based on the occurrence frequencies of the unique constituting elements.

3. The method of claim 2, wherein the method further comprises ordering said unique constituting elements based on their occurrence frequencies.

4. The method of claim 2, wherein the method further comprises storing said constituting elements of the data structure as they are received, using said initial cookie representations, and subsequently replacing the stored initial cookie representations with the final cookie representations, and said transmitting comprises transmitting said constituting elements of said data structure using said final cookie representations.

5. The method of claim 1, wherein the cookie representations are numeric in form, with the cookie representations of the 128 most frequently occurred unique constituting elements having a size of one byte each, and the cookie representations of the next 32,640 most frequently occurred unique constituting elements having a size of two bytes each.

6. The method of claim 1, wherein said data structure is an XML data structure, and said constituting elements comprise tag names, attribute names and attribute values.

7. A method comprising:
  receiving a plurality of unique constituting elements of a data structure transmitted in a pre-determined order based at least in part on the occurrence frequencies of said unique constituting elements;
  inferring a plurality of corresponding cookie representations for the received unique constituting elements in accordance with their manner of transmissions under the pre-determined order of transmission, the plurality of corresponding cookie representations not having been received together with said received unique constituting elements; and
  receiving the constituting elements of the data structure in a representative form encoded with cookie representations.

8. The method of claim 7, wherein said inferring comprises inferring a unique one-byte numeric representation for each of the first 128 unique constituting elements transmitted, and a unique two-bytes representation for each of the next 32,460 unique constituting elements transmitted.

9. The method of claim 7, wherein the method further comprises reconstituting the constituting elements of the data structure, received in said representative form, based on the inferred cookie representations.

10. The method of claim 7, wherein said data structure is an XML data structure, and said constituting elements comprises tag names, attribute names and attribute values.

11. An apparatus comprising:
  storage medium having stored therein a plurality of programming instructions designed to receive a plurality of constituting elements of a data structure, determine occurrence frequency of each unique constituting element in said data structure, assign a cookie representation to each of said unique constituting elements based at least in part on the occurrence frequencies of said unique constituting elements, transmit a list of said unique constituting elements in the order of their occurrence frequencies to allow a receiving of said list of said unique constituting elements to infer the corresponding cookie representations of the unique constituting elements, and transmit said data structure in a representative form encoded with said cookie representations; and
  at least one processor coupled to the storage medium to execute the programming instructions.

12. The apparatus of claim 11, wherein said programming instructions are designed to perform said determining and assigning by assigning an initial cookie representation to each unique constituting element as the constituting elements are received, and tracking occurrence frequencies of the unique constituting elements, and upon receipt of all constituting elements of the data structure, re-assigning a final cookie representation for each of the unique constituting elements based on the occurrence frequencies of the unique constituting elements.

13. The apparatus of claim 12, wherein the programming instructions are further designed to order said unique constituting elements based on their occurrence frequencies.

14. The apparatus of claim 12, wherein the programming instructions are further designed to store said constituting elements of the data structure as they are received, using said initial cookie representations, and subsequently replace the stored initial cookie representations with the final cookie representations, and said programming instructions perform said transmitting by transmitting said constituting elements of said data structure using said final cookie representations.

15. The apparatus of claim 11, wherein the programming instructions are deigned to employ cookie representations in numeric form, with the cookie representations of the 128 most frequently occurred unique constituting elements having a size of one byte each, and the cookie representations of the next 32,640 most frequently occurred unique constituting elements having a size of two bytes each.

16. The apparatus of claim 11, wherein said programming instructions are designed to perform said receive, determine, assign and transmit for an XML data structure, said constituting elements comprising tag names, attribute names and attribute values.

17. The apparatus of claim 11, wherein said apparatus is a selected one of a wireless mobile phone, a palm sized personal digital assistant, a notebook sized computer, a desktop computer, a set top box and a server.

18. An apparatus comprising:
  storage medium having stored therein a plurality of programming instructions designed to receive a plurality of unique constituting elements of a data structure transmitted in a pre-determined order based at least in part on the occurrence frequencies of said unique constituting elements, to infer a plurality of corresponding cookie representations for the received unique constituting elements in accordance with their manner of transmissions under the predetermined order of transmission, the plurality of corresponding cookie representations not having been received together with said received unique constituting elements, and to receive the constituting elements of the data structure in a representative form encoded with cookie representations; and
  at least one processor coupled to the storage medium to execute the programming instructions.

19. The apparatus of claim 18, wherein said programming instructions are designed to infer a unique one-byte numeric representation for each of the first 128 unique constituting elements transmitted, and a unique two-bytes representation for each of the next 32,460 unique constituting elements transmitted.

20. The apparatus of claim 18, wherein said programming instructions are further designed to reconstitute the constituting elements of the data structure, received in said representative form, based on the inferred cookie representations.

21. The apparatus of claim 18, wherein said programming instructions are designed to perform said receive, infer, receive, and re-constitute for a XML data structure, said constituting elements comprising tag names, attribute names and attribute values.

22. The apparatus of claim 18, wherein said apparatus is a selected one of a wireless mobile phone, a palm sized personal digital assistant, a notebook sized computer, a desktop computer, a set top box and a server.

* * * * *